United States Patent
Katoh

(10) Patent No.: US 9,001,953 B2
(45) Date of Patent: Apr. 7, 2015

(54) PHASE INTERPOLATION CIRCUIT AND RECEIVER CIRCUIT

(71) Applicant: Fujitsu Semiconductor Limited, Yokohama, Kanagawa (JP)

(72) Inventor: Toshie Katoh, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/144,075

(22) Filed: Dec. 30, 2013

(65) Prior Publication Data

US 2014/0211898 A1    Jul. 31, 2014

(30) Foreign Application Priority Data

Jan. 28, 2013  (JP) ................... 2013-012797

(51) Int. Cl.
*H04L 7/00* (2006.01)
*H03H 11/20* (2006.01)
*H04L 7/033* (2006.01)

(52) U.S. Cl.
CPC .............. *H03H 11/20* (2013.01); *H04L 7/0025* (2013.01); *H04L 7/033* (2013.01); *H04L 7/0337* (2013.01)

(58) Field of Classification Search
CPC ................... H03H 11/20; H04L 7/00

USPC .................... 375/371, 372, 373, 374
See application file for complete search history.

(56) References Cited

U.S. PATENT DOCUMENTS

| | | |
|---|---|---|
| 2005/0017780 A1 | 1/2005 | Baba |
| 2007/0147564 A1* | 6/2007 | Fan et al. ............. 375/355 |
| 2007/0177700 A1 | 8/2007 | Saeki |
| 2007/0201597 A1* | 8/2007 | He et al. ............. 375/376 |
| 2009/0225917 A1 | 9/2009 | Takagi |
| 2011/0102028 A1 | 5/2011 | Nedachi |

FOREIGN PATENT DOCUMENTS

| | | |
|---|---|---|
| JP | 2004-159163 A | 6/2004 |
| JP | 2004-282360 A | 10/2004 |
| JP | 2007-208615 A | 8/2007 |
| JP | 2009-212922 A | 9/2009 |
| JP | 2011-97314 A | 5/2011 |

* cited by examiner

*Primary Examiner* — Jaison Joseph
(74) *Attorney, Agent, or Firm* — Arent Fox LLP

(57) ABSTRACT

A phase interpolation circuit includes: a first circuit configured to generate a first intermediate signal by weighting first reference signals having different phases with a first ratio and combining weighed first reference signals; a second circuit configured to generate a second intermediate signal by weighing second reference signals having phases different from the phases of the first reference signals by a certain value with a second ratio equal to the first ratio and combining weighted second reference signals; and a third circuit configured to generate an output signal by combining the first intermediate signal and the second intermediate signal.

17 Claims, 13 Drawing Sheets

FIG. 4

| PI CODE | PHASE | CK0 | CK90 |
|---|---|---|---|
| 0 | 0.00 | 48.0 | 0.0 |
| 1 | 2.44 | 46.5 | 1.5 |
| 2 | 4.97 | 45.0 | 3.0 |
| 3 | 7.59 | 43.5 | 4.5 |
| 4 | 10.30 | 42.0 | 6.0 |
| 5 | 13.09 | 40.5 | 7.5 |
| 6 | 15.95 | 39.0 | 9.0 |
| 7 | 18.85 | 37.5 | 10.5 |
| 8 | 21.80 | 36.0 | 12.0 |
| 9 | 24.78 | 34.5 | 13.5 |
| 10 | 27.76 | 33.0 | 15.0 |
| 11 | 30.74 | 31.5 | 16.5 |
| 12 | 33.69 | 30.0 | 18.0 |
| 13 | 36.61 | 28.5 | 19.5 |
| 14 | 39.47 | 27.0 | 21.0 |
| 15 | 42.27 | 25.5 | 22.5 |
| 16 | 45.00 | 24.0 | 24.0 |
| 17 | 47.73 | 22.5 | 25.5 |
| 18 | 50.53 | 21.0 | 27.0 |
| 19 | 53.39 | 19.5 | 28.5 |
| 20 | 56.31 | 18.0 | 30.0 |
| 21 | 59.26 | 16.5 | 31.5 |
| 22 | 62.24 | 15.0 | 33.0 |
| 23 | 65.22 | 13.5 | 34.5 |
| 24 | 68.20 | 12.0 | 36.0 |
| 25 | 71.15 | 10.5 | 37.5 |
| 26 | 74.05 | 9.0 | 39.0 |
| 27 | 76.91 | 7.5 | 40.5 |
| 28 | 79.70 | 6.0 | 42.0 |
| 29 | 82.41 | 4.5 | 43.5 |
| 30 | 85.03 | 3.0 | 45.0 |
| 31 | 87.56 | 1.5 | 46.5 |
| 32 | 90.00 | 0.0 | 48.0 |

FIG. 10

| PI CODE | PHASE | CK0 | CK45 | CK90 | CK135 |
|---|---|---|---|---|---|
| 0 | 0.00 | 48 | 0 | 0 | 0 |
| 1 | 2.44 | 45 | 3 | 0 | 0 |
| 2 | 4.97 | 42 | 6 | 0 | 0 |
| 3 | 7.59 | 39 | 9 | 0 | 0 |
| 4 | 10.30 | 36 | 12 | 0 | 0 |
| 5 | 13.09 | 33 | 15 | 0 | 0 |
| 6 | 15.95 | 30 | 18 | 0 | 0 |
| 7 | 18.85 | 27 | 21 | 0 | 0 |
| 8 | 21.80 | 24 | 24 | 0 | 0 |
| 9 | 24.78 | 21 | 27 | 0 | 0 |
| 10 | 27.76 | 18 | 30 | 0 | 0 |
| 11 | 30.74 | 15 | 33 | 0 | 0 |
| 12 | 33.69 | 12 | 36 | 0 | 0 |
| 13 | 36.61 | 9 | 39 | 0 | 0 |
| 14 | 39.47 | 6 | 42 | 0 | 0 |
| 15 | 42.27 | 3 | 45 | 0 | 0 |
| 16 | 45.00 | 0 | 48 | 0 | 0 |
| 17 | 47.73 | 0 | 45 | 3 | 0 |
| 18 | 50.53 | 0 | 42 | 6 | 0 |
| 19 | 53.39 | 0 | 39 | 9 | 0 |
| 20 | 56.31 | 0 | 36 | 12 | 0 |
| 21 | 59.26 | 0 | 33 | 15 | 0 |
| 22 | 62.24 | 0 | 30 | 18 | 0 |
| 23 | 65.22 | 0 | 27 | 21 | 0 |
| 24 | 68.20 | 0 | 24 | 24 | 0 |
| 25 | 71.15 | 0 | 21 | 27 | 0 |
| 26 | 74.05 | 0 | 18 | 30 | 0 |
| 27 | 76.91 | 0 | 15 | 33 | 0 |
| 28 | 79.70 | 0 | 12 | 36 | 0 |
| 29 | 82.41 | 0 | 9 | 39 | 0 |
| 30 | 85.03 | 0 | 6 | 42 | 0 |
| 31 | 87.56 | 0 | 3 | 45 | 0 |
| 32 | 90.00 | 0 | 0 | 48 | 0 |

PHASE INTERPOLATION CIRCUIT AND RECEIVER CIRCUIT

CROSS-REFERENCE TO RELATED APPLICATION

This application is based upon and claims the benefit of priority of the prior Japanese Patent Application No. 2013-012797, filed on Jan. 28, 2013, the entire contents of which are incorporated herein by reference.

FIELD

A certain aspect of the embodiments discussed herein is related to a phase interpolation circuit and a receiver circuit.

BACKGROUND

A CDR (Clock Data Recovery) circuit is used in a receiver circuit that receives signals at high bit rates. The receiver circuit acquires data from the received signal in accordance with a clock signal. However, a difference in phase between the received signal and the clock signal may lose some data from the received signal. Thus, the phase difference between the received signal and the clock signal is detected, and the phase of the clock signal is adjusted on the basis of the phase difference. The adjustment of the phase of the clock signal utilizes a phase interpolation circuit that generates a clock signal from a plurality of reference clock signals (see Japanese Laid-Open Patent Application Nos. 2004-282360, 2011-097314, 2004-159163, 2007-208616 and 2009-212922, for example).

The phase interpolation circuit generates a PI (Phase Interpolator) code from the phase difference between the received signal and the clock signal. The PI code is used to adjust the phase of the clock signal by weighting a plurality of reference signals having mutually different phases and combining the weighted reference signals. With respect to the PI code, it is preferable the phase change of the clock signal is linear.

SUMMARY

According to an aspect of the present invention, there is provided a phase interpolation circuit including: a first circuit configured to generate a first intermediate signal by weighting first reference signals having different phases with a first ratio and combining weighed first reference signals; a second circuit configured to generate a second intermediate signal by weighing second reference signals having phases different from the phases of the first reference signals by a certain value with a second ratio equal to the first ratio and combining weighted second reference signals; and a third circuit configured to generate an output signal by combining the first intermediate signal and the second intermediate signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram that illustrates the phase of a clock signal OUT0 and the weighting ratio of reference clock signals CK0 and CK90 in association with a PI code;

FIG. 10 is a diagram that illustrates the phase of the clock signal OUT0, and the weighing ratio of reference clock signals CK0, CK45, CK90 and CK135 in association with the PI code;

DESCRIPTION OF EMBODIMENTS

Figure 1:
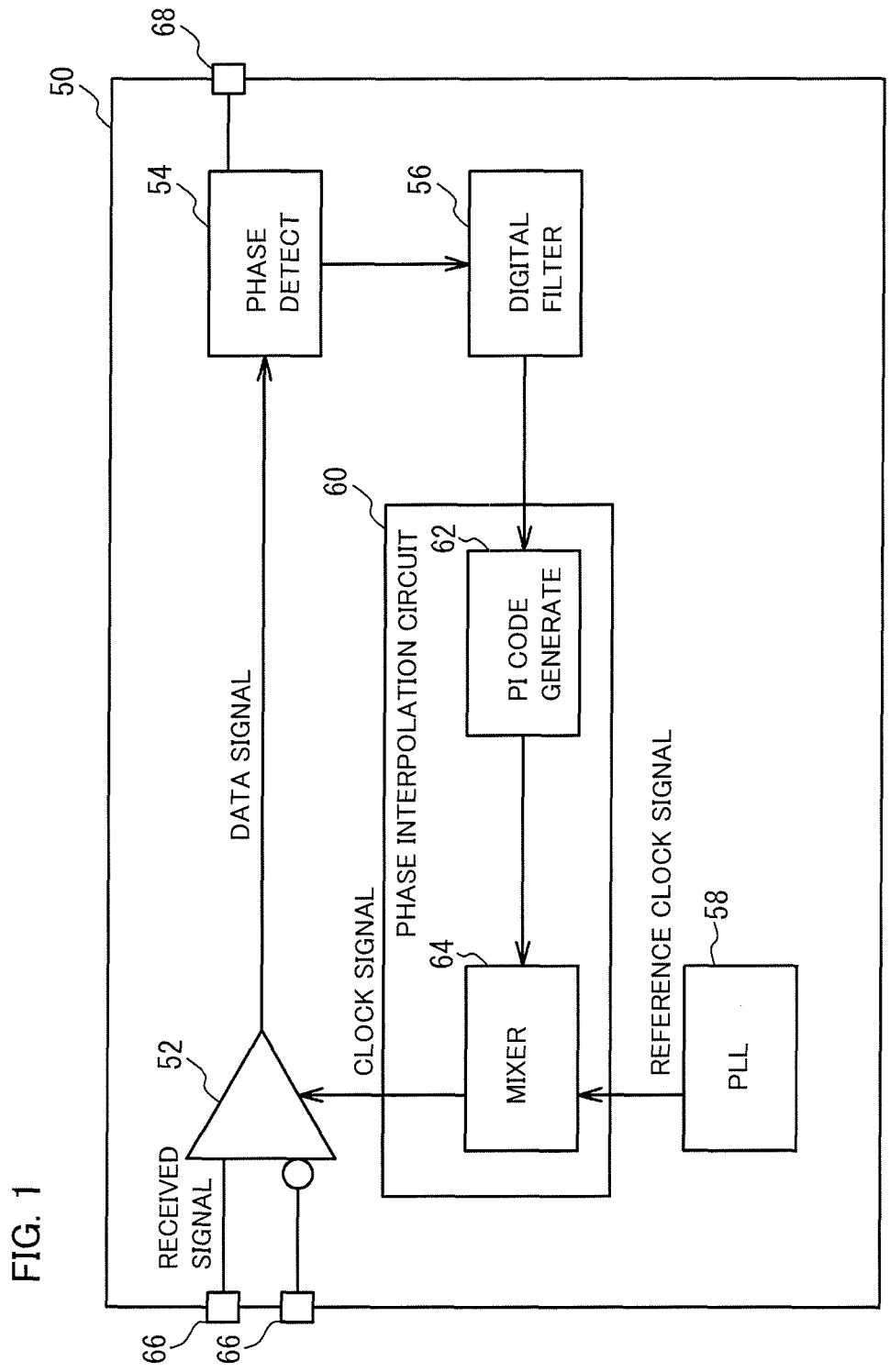
FIG. 1 is a block diagram of a CDR circuit in which a phase interpolation circuit is used.

FIG. 1 is a block diagram of a CDR circuit in which a phase interpolation circuit is used. Referring to FIG. 1, a CDR circuit 50 includes a receiver 52, a phase detection circuit 54, a digital filter 56, a PLL (Phase Locked Loop) circuit 58 and a phase interpolation circuit 60. The CDR circuit 50 is formed in a semiconductor chip on which a system LSI (Large Scale Integrated circuit) is formed. The phase interpolation circuit 60 includes a PI code generating circuit 62 and a mixer 64. A received signal is input to an input terminal 66. The receiver 52 acquires data from the received signal in accordance with a clock signal. For example, the receiver 52 acquires data from the received signal in synchronism with the rising or falling edge of the clock signal. A data signal is output through an output terminal 68. The phase detection circuit 54 detects the phase difference between the received signal and the clock signal from the data signal. The digital filter 56 filters a detected signal.

The PLL circuit 58 outputs a plurality of reference clock signals having mutually different phases to the phase interpolation circuit 60. The PI code generating circuit 62 generates the PI code from the output signal of the digital filter 56. The PI code generating circuit 62 generates the PI code on the basis of the phase difference between the received signal and the clock signal. The mixer 64 generates the clock signal by mixing the plurality of reference clock signals having the mutually different phases with each other in accordance with the PI code. In other words, the phase interpolation circuit 60 performs a phase interpolation with the plurality of reference clock signals having the mutually different phases in order to generate the clock signal.

Figure 2:
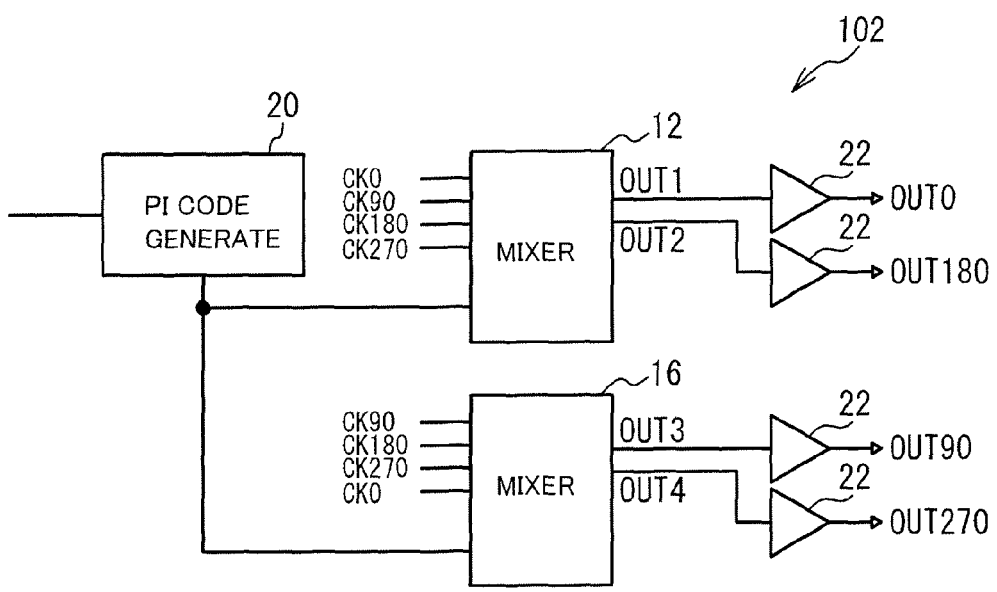
FIG. 2 is a block diagram of a phase interpolation circuit in accordance with a first comparative example.

Now, comparative examples are described. FIG. 2 is a block diagram of a phase interpolation circuit in accordance with a first comparative example. Referring to FIG. 2, a phase interpolation circuit 102 includes mixers 12 and 16, a PI code generating circuit 20 and buffers 22. The mixer 12 weights reference clock signals CK0, CK90, CK180 and CK270 of four phases, and combines the weighted reference clock signals to thus generate output signals OUT1 and OUT2. The mixer 16 weights the reference clock signals CK90, CK180, CK270 and CK0 of the four phases, and combines the weighted reference clock signals to thus generate output signals OUT3 and OUT4. Each of the buffers 22 (for example, inverters) is supplied with a respective one of the output signals OUT1, OUT2, OUT3 and OUT4 of the mixers 12 and 16. The buffers 22 amplify the output signals OUT1 through OUT4, and output amplified output signals as the clock signals OUT0, OUT90, OUT180 and OUT270. The PI code generating circuit 20 generates the PI code on the basis of the output signal of the digital filter 56 illustrated in FIG. 1, and outputs the PI code to the mixers 12 and 16. The PI code is a code that indicates the ratio of weighting with which the plurality of reference signals are combined.

The reference clock signals CK0, CK90, CK180 and CK270 are reference signals having phases of 0°, 90°, 180° and 270°, respectively. The clock signals OUT0, OUT90, OUT180 and OUT270 are clock signals having phases of 0°, 90°, 180° and 270°, respectively.

Figure 3:
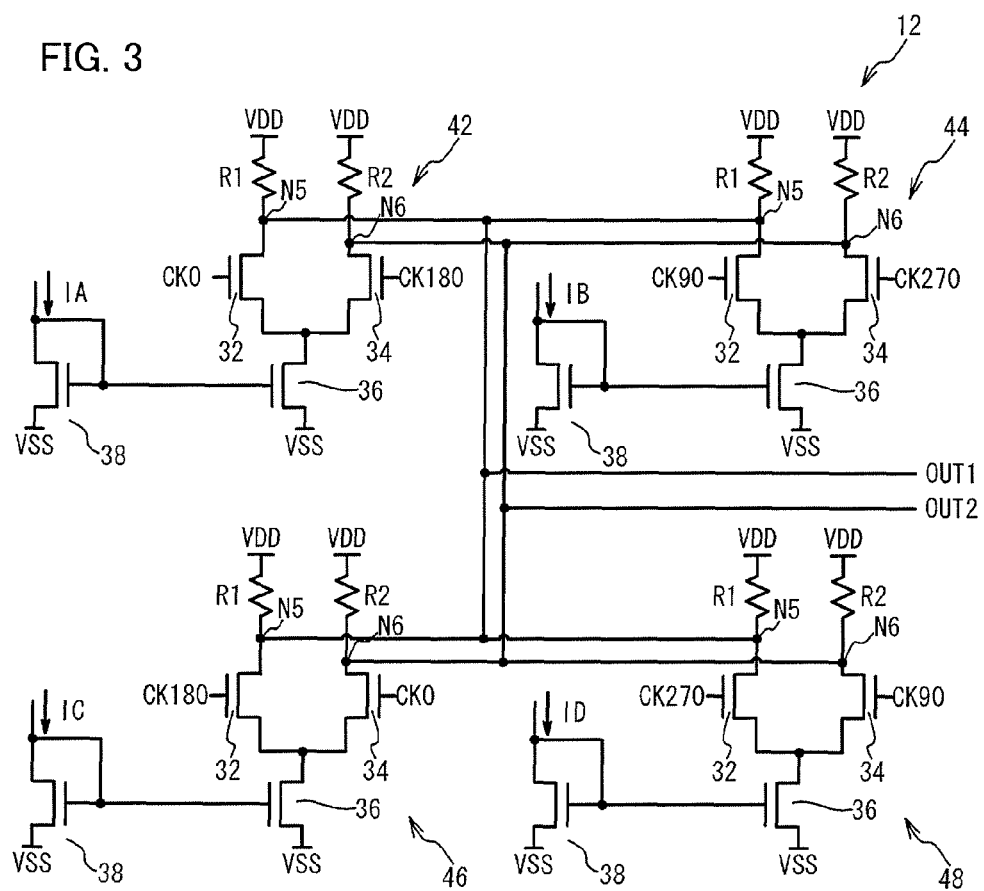
FIG. 3 is a circuit diagram of a mixer.

FIG. 3 is a circuit diagram of an exemplary circuit configuration of the mixer 12. Referring to FIG. 3, the mixer 12 includes circuits 42, 44, 46 and 48. Each of the circuits 42, 44, 46 and 48 includes transistors 32, 34, 36 and 38 and resistors R1 and R2. The transistors 32, 34, 36 and 38 are n-type MOSFETs (Metal Oxide Semiconductor Field Effect Transistors), for example.

The drains of the transistors 32 and 34 are connected to a power supply VDD through the resistors R1 and R2, respectively. Nodes N5 and N6 are located between the drains of the transistors 32 and 34 and the resistors R1 and R2, respectively. The sources of the transistors 32 and 34 are interconnected, and are connected to a power supply VSS through the transistor 36. The gates of the transistors 32 and 34 are supplied with the reference clock signals CK0 and CK180, respectively.

The drain of the transistor 36 is connected to the sources of the transistors 32 and 34, which sources are connected to the power supply VSS. The transistor 36 functions as a current source that generates currents that flow through the transistors 32 and 34. The transistors 36 and 38 form a current mirror circuit. A current flows through the transistor 36 with a certain ratio to a current IA that flows from the drain to the source of the transistor 38. The currents that flow through the transistors 32 and 34 can be controlled by changing the magnitude of the current IA.

The reference clock signals CK90 and CK270 are applied to the gates of the transistors 32 and 34 of the circuit 44, respectively. The gates of the transistors 32 and 34 of the circuit 46 are supplied with the reference clock signals CK180 and CK0, respectively. The gates of the transistors 32 and 34 of the circuit 48 are supplied with the reference clock signals CK270 and CK90, respectively. Currents IB, IC and ID flow through the transistors 38 of the circuits 44, 46 and 48, respectively.

The nodes N5 of the circuits 42, 44, 46 and 48 are connected together and are output as a signal OUT1. The nodes N6 of the circuits 42, 44, 46 and 48 are connected together and are output as a signal OUT2. It is possible to realize arbitrary phases of the clock signals OUT0 and OUT180 by setting the ratio of the current IA through ID to a desired value. The currents IA through ID are controlled in accordance with the PI code. The mixer 12 may have a differential-input/differential-output structure. This configuration realizes the stable operation of the mixer 12.

For example, when the phase is controlled between 0° and 90°, the currents IC and ID are set to zero, and the ratio of the currents IA and IB is set to a desired value. It is thus possible to set the phase of the clock OUT0 to a desired value between 0° and 90°. When the currents ID and IA are set to zero and the ratio of the currents IB and IC is set to a desired value, the phase of the clock signal OUT0 can be set to a desired value between 90° and 180°. When the currents IA and IB are set to zero and the ratio of the currents IC and ID is set to a desired value, the phase of the clock signal OUT0 can be set to a desired value between 180° and 270°. When the currents IB and IC are set to zero and the ratio of the currents ID and IA is set to a desired value, the phase of the clock signal OUT0 can be set to a desired value between 270° and 360°.

FIG. 4 is a diagram that illustrates the phase of the clock signal OUT0 and the weighting ratio of the reference clock signals CK0 and CK90 in association with the PI code. It is assumed that the PI code has values of 0 to 32, and the clock signal OUT0 has phases between 0° and 90°. The weighing ratio of the reference clock signals CK0 and CK90 is set to values between 48:0 and 0:48. The weighting ratio of the reference clock signals CK90 and CK180 is similarly set when the phase of the clock signal OUT0 is controlled between 90° and 180°. The weighing ratio is similarly set when the phase of the clock signal OUT0 is controlled between 180° and 270° and between 270° and 360°.

In the mixer 16, the reference clock signals CK90 and CK270 are input to the gates of the transistors 32 and 34 of the circuit 42, respectively. The reference clock signals CK180 and CK0 are input to the gates of the transistors 32 and 34 of the circuit 44, respectively. The reference clock signals CK270 and CK90 are input to the gates of the transistors 32 and 34 of the circuit 46, respectively. The reference clock signals CK0 and CK180 are input to the gates of the transistors 32 and 34 of the circuit 48, respectively. The nodes N5 of the circuits 42, 44, 46 and 48 are combined, and are output as signal OUT3. The nodes N6 of the circuits 42, 44, 46 and 48 are combined, and are output as signal OUT4. The other structures of the mixer 16 are the same as those of the mixer 12.

Figure 5:
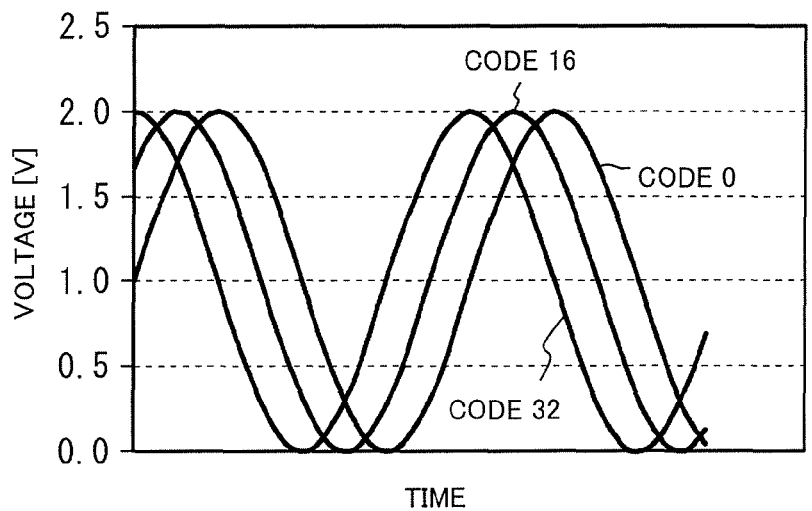
FIG. 5 is a waveform diagram of clock signals generated in the first comparative example.

FIG. 5 is a diagram of some clock signals generated in the first comparative example. More particularly, there are illustrated waveforms of an output clock signal generated from the reference clock signals CK0 and CK90. More specifically, FIG. 5 illustrates waveforms of the clock signal OUT0 that are respectively obtained when the PI code is 0, 16 and 32. When the PI code is 0, the ratio of the reference clock signal CK0 is 100%. When the PI code is 16, the ratio of the reference clock signals CK0 and CK90 is 50:50. When the PI code is 32, the ratio of the reference clock signal CK90 is 100%. If the reference clock signals CK0 and CK90 are sine waves, the phase of the clock signal OUT0 changes linearly with respect to the PI code. However, the sine wave of the clock signal is not suitable for broad-banding (for example, 1 GHz to 5 GHz).

Figure 6:
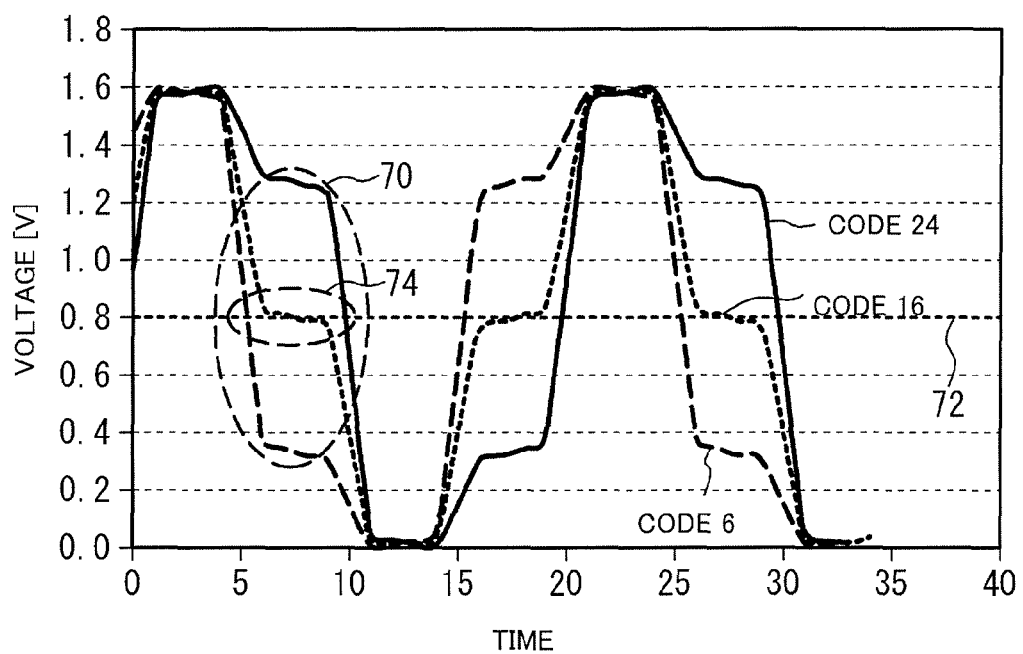
FIG. 6 is a waveform diagram of an output signal OUT1 from a mixer in the first comparative example.

FIG. 6 is a diagram that illustrates some output signal OUT1 from the mixer 12 in the first comparative example. FIG. 6 illustrates the voltage associated with time (arbitrary coordinate, this holds true for the following). FIG. 6 illustrates waveforms of the output signal from the mixer 12 generated from the reference clock signals CK0 and CK90 when the clock signals have rectangular waveforms. The illustrated waveforms correspond to cases where the PI code is 6, 16 and 24 (where the ratio of the reference clock signals CK0 and CK90 are 20:20, 50:50 and 80:20). The waveforms of the output signal OUT1 of the mixer 12 have steps 70.

Figure 7:
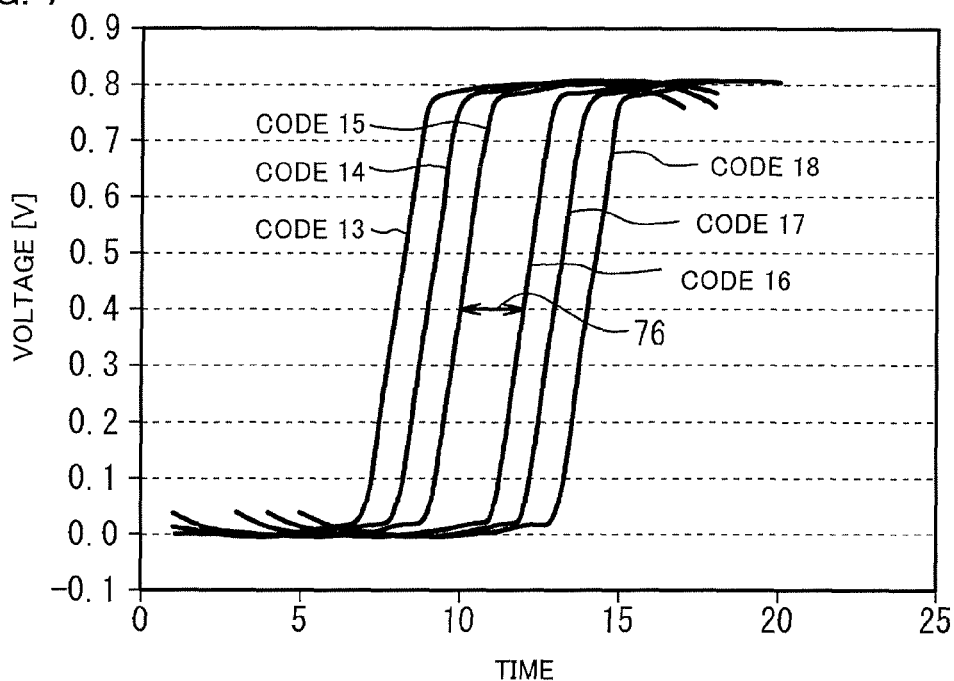
FIG. 7 is a waveform diagram of an output signal OUT0 from a buffer in the first comparative example.

FIG. 7 is a diagram that illustrates some waveforms of the output signal OUT0 from the buffer in the first comparative example. Since the buffer 22 is an inverter, the falling edge of the output signal from the mixer 12 corresponds to the rising edge of the output signal from the buffer 22. For example, when the output signal OUT1 illustrated in FIG. 6 crosses 0.8 V that is a midpoint 72 between the high level and the low level, waveforms in FIG. 7 change from the low level to the high level. In FIG. 6, if the waveform has a step 74 near the midpoint 72, as indicated by an arrow 76 in FIG. 7, the rising time for the PI code changes greatly. Thus, the phase of the clock signal for the PI code does not change linearly.

Figure 8:
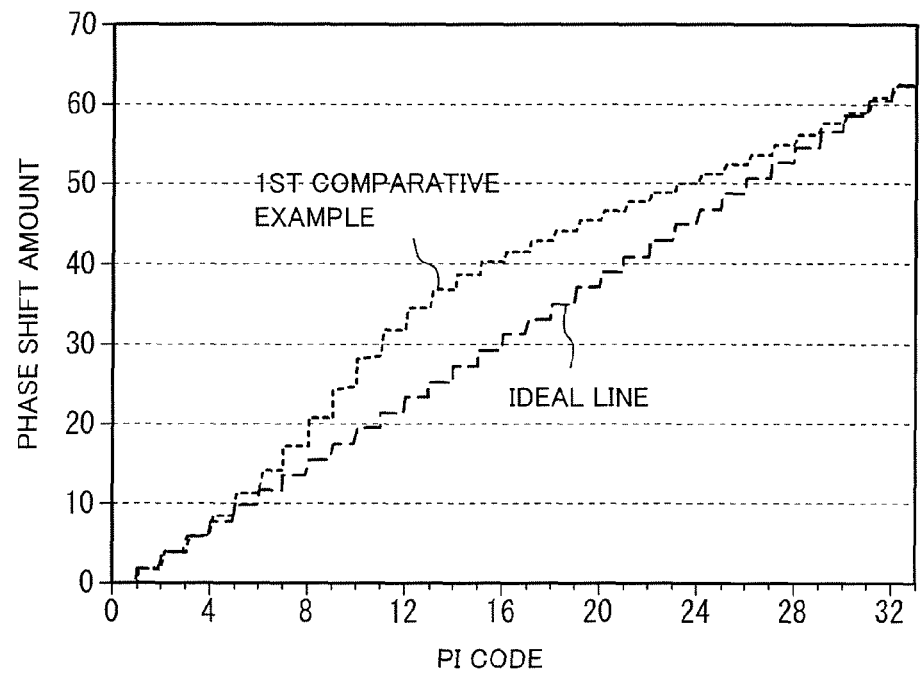
FIG. 8 is a diagram that illustrates a relation between the phase shift amount and the PI code.

FIG. 8 is a diagram that illustrates the phase of the clock signal associated with the PI code. A broken line indicates an ideal relation between the PI code and the clock signal OUT0. Ideally, the phase changes linearly in association with the PI code. A dotted line indicates a phase relation between the PI code and the clock signal in the first comparative example. The phase does not change linearly in association with the PI code. As the frequency of the reference clock signal is lower, the cycle of the reference clock signal is longer. Thus, the non-linearity is further strengthened.

Figure 9:
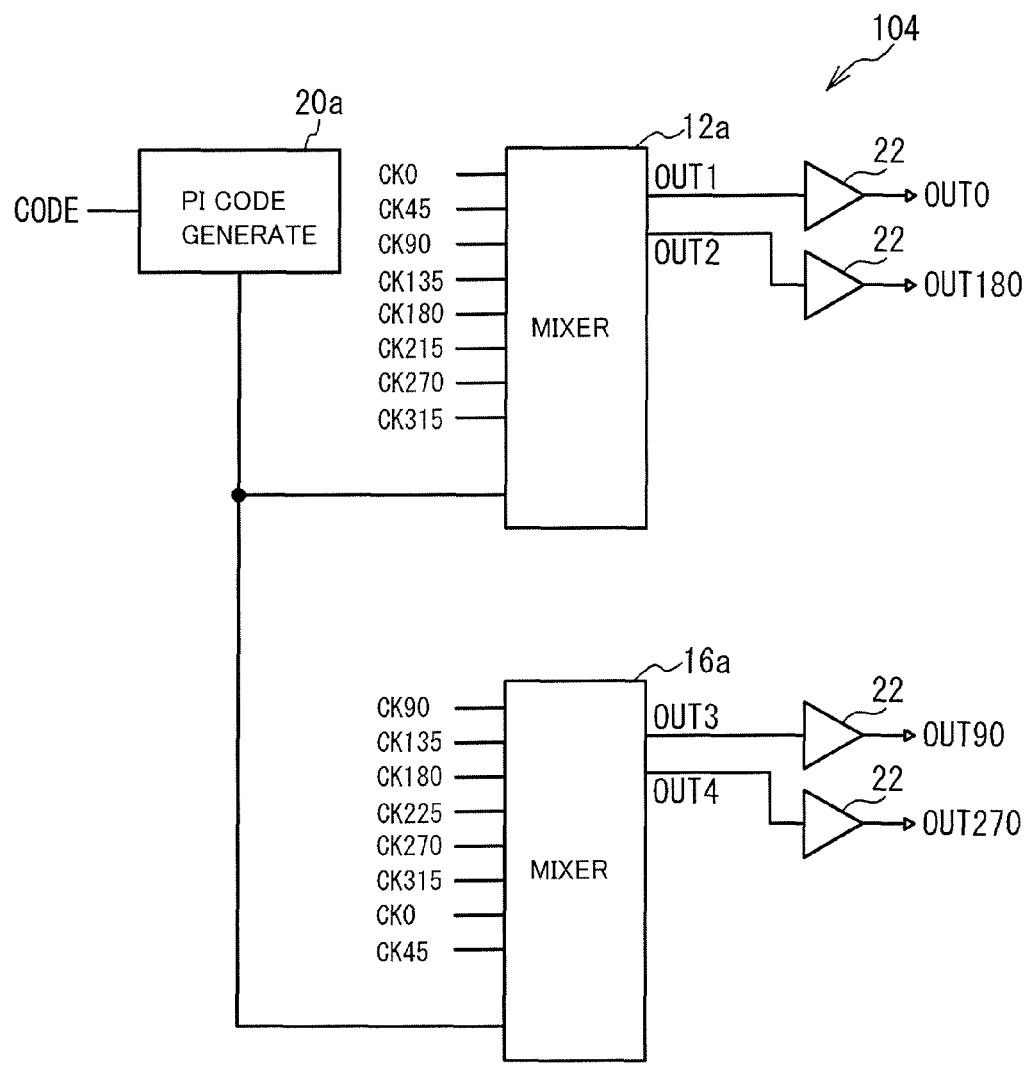
FIG. 9 is a block diagram of a phase interpolation circuit in accordance with a second comparative example.

Now, a description is given of a second comparative example in which the phase in association with the PI code is made closer to the linear relation. FIG. 9 is a block diagram of a phase interpolation circuit in accordance with a second comparative example. Referring to FIG. 9, a phase interpolation circuit 104 includes a PI code generating circuit 20a, and mixers 12a and 16a. The mixers 12a and 16a are supplied with reference clock signals having eight phases CK0, CK45, CK90, CK135, CK180, CK225, CK270 and CK315. The mixer 12a weights the eight reference clock signals having the mutually different phases and combines the weighted reference clock signals, so that outputs OUT1 and OUT2 are generated. The mixer 16a weights the eight reference clock signals having the mutually different phases and combines the weighted reference clock signals, so that outputs OUT3 and OUT4 are generated. Each of the mixers 12a and 16a includes eight circuits, each of which corresponds to the circuit 42. The PI code generating circuit 20a outputs the PI code that indicates the weighting of the eight reference clock signals.

The reference clock signals CK0, CK45, CK90, CK135, CK180, CK225, CK270 and CK315 are signals having phases of 0°, 45°, 90°, 135°, 180°, 225°, 270° and 315°.

FIG. 10 shows examples of the phase of the clock signal OUT0 and the weighting ratios of the reference clock signals CK0, CK45, CK90 and CK135 in association with the PI code. The PI code changes from 0 to 32, and the phase of the clock signal OUT0 changes from 0° to 90° accordingly. When the PI code is between 0 and 16, the weighting ratio of the reference clock signals CK0 and CK45 is set between 48:0 and 0:48. When the PI code is between 16 and 32, the weight ratio of the reference clock signals CK45 and CK90 is set between 48:0 and 0:48. Within this range, the ratio of the reference clock CK135 is 0.

Figure 11:
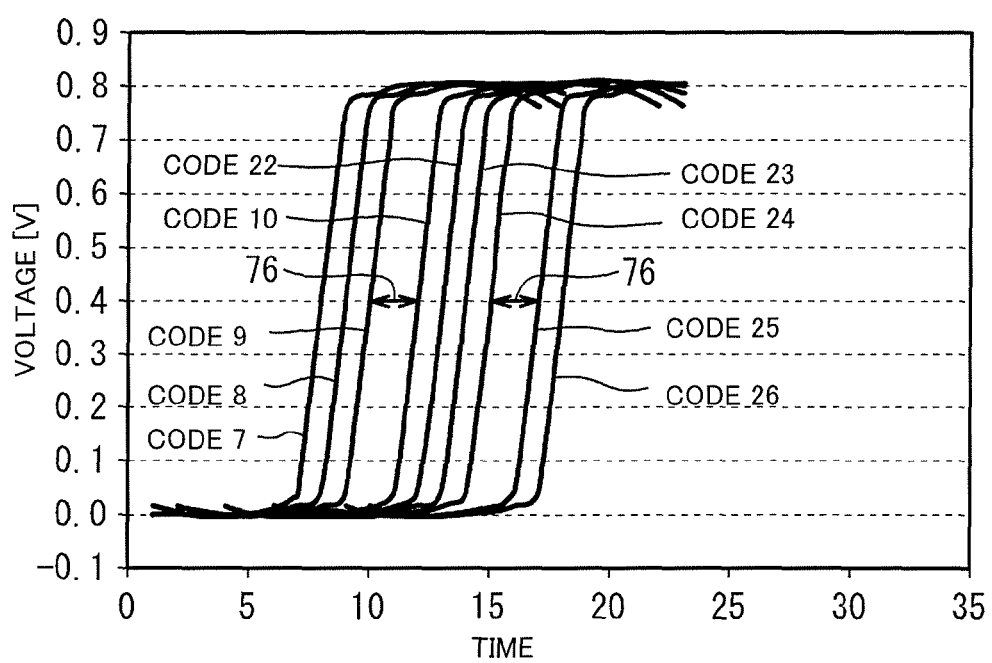
FIG. 11 is a waveform diagram of a clock signal OUT0 from a buffer in a second comparative example.

FIG. 11 is a diagram of the clock signal OUT0 output from the buffer in the second comparative example. FIG. 11 illustrates waveforms of the output signal OUT0 from the buffer 22 in association with the PI code when the clock signals have rectangular waveforms. As indicated by arrows 76 in FIG. 11, the changes of the rising time associated with the PI code are smaller than those in the first comparative example. According to the second comparative example, the linearity of the phase of the clock signal in association with the PI code is improved.

However, the PI code generating circuit 20a of the second comparative example generates the PI code that indicates the weighting of the eight reference signals having the mutually different phases. Thus, the PI code generating circuit 20a is more complicated than the PI code generating circuit 20 used in the first comparative example. Further, the mixers 12a and 16b have circuit configurations capable of handling the reference clock signals having the eight mutually different phases, and are thus more complicated than the mixers 12 and 16 used in the first comparative example. As described above, as an increased number of phases of the reference clock signals makes the circuit configurations more complicated, and a new circuit design is therefore expected. Now, a description is given of embodiments that employ configurations similar to those of the PI code generating circuit 20 and the mixers 12 and 16 and is capable of weighting the reference clock signals having the eight mutually different phases.

Figure 12:
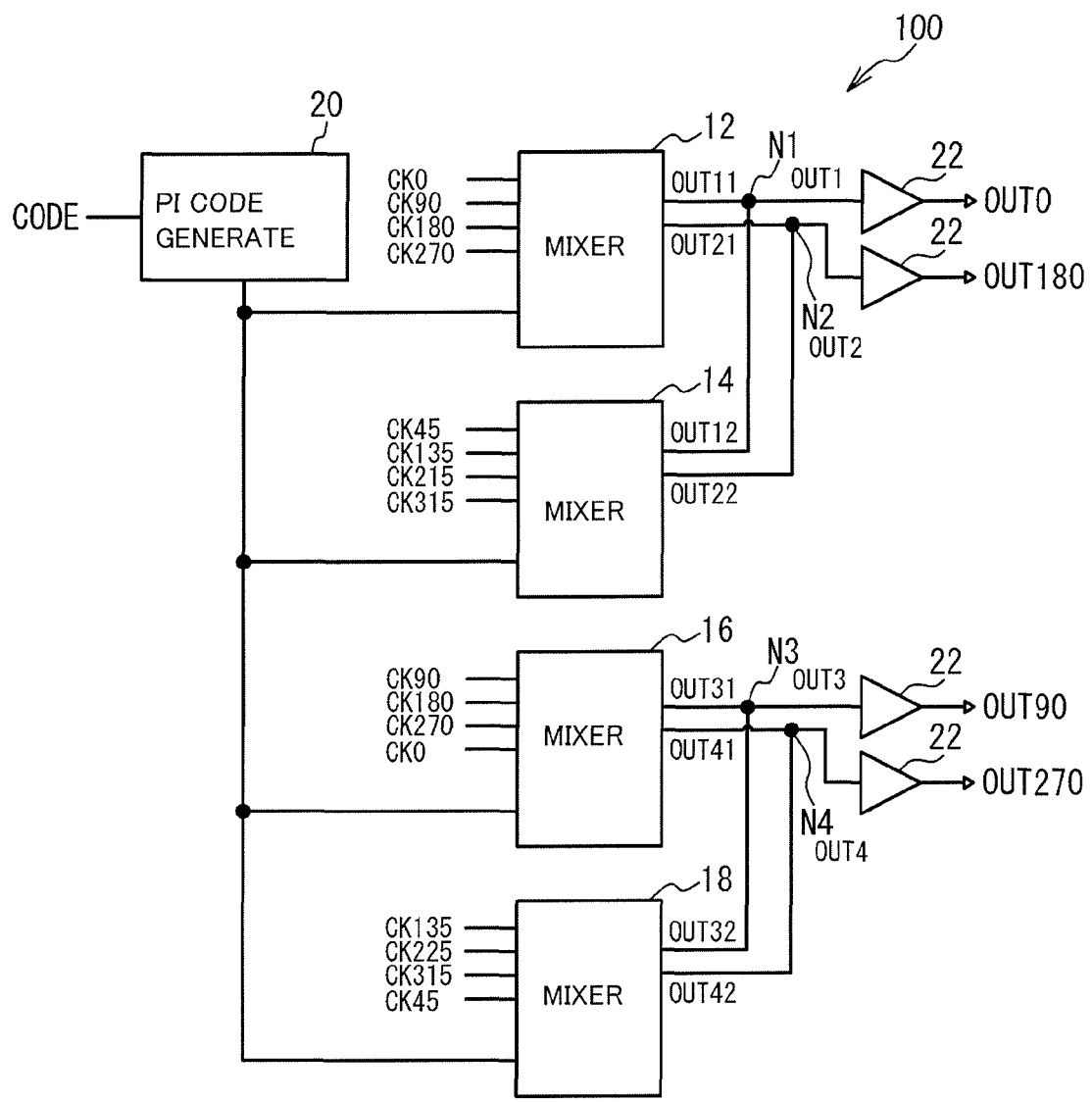
FIG. 12 is a block diagram of a phase interpolation circuit in accordance with the first embodiment.

FIG. 12 is a block diagram of a phase interpolation circuit in accordance with a first embodiment. Referring to FIG. 12, a phase interpolation circuit 100 includes the PI code generating circuit 20, mixers 12, 14, 16 and 18, and buffers 22. The PI code generating circuit 20 generates the same PI code (for example, FIG. 4) as that employed in the first comparative example. That is, the PI code generating circuit 20 generates the PI code that indicates the weighting of the reference clock signals having the four mutually different phases. The mixers 12, 14, 16 and 18 may have the same circuit configuration as illustrated in FIG. 3, and weights the reference clock signals having the four mutually different phases in accordance with the PI code. Currents IA, IB, IC and ID of the mixers 12, 14, 16 and 18 are set half the currents of the mixers 12 and 16 of the first comparative example. This current setting is based on the following. The clock signal is generated by combining the reference clock signals having a phase twice the phase of the first comparative example, as will be described later. If the same currents as those of the first comparative example are used, the clock signal generated therefrom has an amplitude that is twice the amplitude of the clock signal in the first comparative example. The currents IA through ID may be the same as those in the first comparative example, and the size of the transistor in FIG. 3 (for example, the gate width) may be doubled.

The mixer 12 weights the reference clocks CK0, CK90, CK180 and CK270 having the four mutually different phases and combines the weighted reference clocks to output signals OUT11 and OUT21. The mixer 14 weights the reference clocks CK45, CK135, CK225 and CK315 having the four mutually different phases and combines the weighted reference clocks to output signals OUT12 and OUT22. At a node N1, the signals OUT11 and OUT12 are combined without any phase changes, and signal OUT1 is thus obtained. For example, the output signal OUT1 is available at the node N1 by physically interconnecting an output signal line of the mixer 12 through which the signal OUT11 is transmitted, an output signal line of the mixer 14 through which the signal OUT12 is transmitted, and a signal line through which the signal OUT1 is transmitted. At a node N2, the signals OUT21 and OUT22 are combined without any phase changes, and signal OUT2 is thus obtained. For example, the output signal OUT2 is available at the node N2 by physically interconnecting an output signal line of the mixer 12 through which the signal OUT21 is transmitted, an output signal line of the mixer 14 through which the signal OUT22 is transmitted, and a signal line through which the signal OUT2 is transmitted.

The mixer 16 weights the reference clock signals CK90, CK180, CK270 and CK0 having the four mutually different phases and combines the weighted reference clocks to output signals OUT31 and OUT41. The mixer 18 weights the reference clocks CK135, CK225, CK315 and CK45 and combines the weighted reference clocks to output signals OUT32 and OUT42. At a node N3, the signals OUT31 and OUT32 are combined without any phase changes, and signal OUT3 is thus obtained. For example, the output signal OUT3 is available at the node N3 by physically interconnecting an output signal line of the mixer 16 through which the signal OUT31 is transmitted, an output signal line of the mixer 18 through which the signal OUT32 is transmitted, and a signal line through which the signal OUT3 is transmitted. At a node N4, the signals OUT41 and OUT42 are combined without any phase changes, and signal OUT4 is thus obtained. For example, the output signal OUT4 is available at the node N4 by physically interconnecting an output signal line of the mixer 16 through which the signal OUT41 is transmitted, an output signal line of the mixer 18 through which the signal OUT42 is transmitted, and a signal line through which the signal OUT4 is transmitted.

The reference clock signals CK0, CK90, CK180, CK270, CK45, CK135, CK225 and CK315 have an identical frequency.

Figure 13:
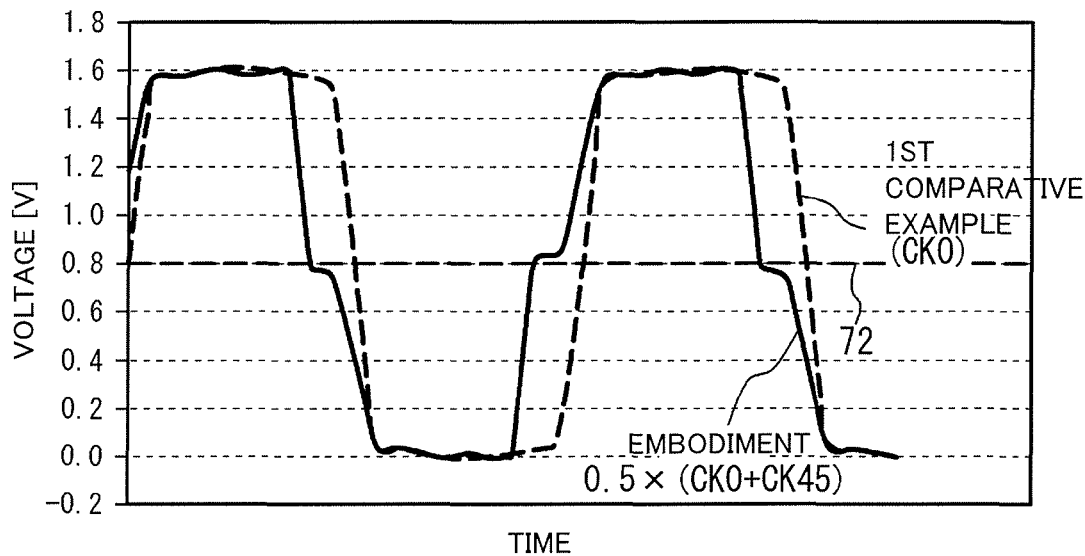
FIG. 13 is a waveform diagram of the output signals OUT1 from the mixers in the first comparative example and the first embodiment.

FIG. 13 is a diagram of examples of the output signals OUT1 from the mixers of the first comparative example and the first embodiment. Referring to FIG. 13, the PI code is 0 in both the first comparative example and the first embodiment. Under this condition, the reference clock signal CK0 is the output signal OUT1 in the first comparative example. In the first embodiment, the output signal OUT11 of the mixer 12 is the output signal OUT11, and the output signal OUT12 of the mixer 14 is the reference clock signal CK45. Thus, the signal OUT1 is a signal defined by weighing the reference clock signals CK0 and CK45 with a ratio of 50:50 and combining the weighted clock signals. The signal OUT1 in the first comparative example is an approximately rectangular wave. The signal OUT1 in the first embodiment is 22.5° out of phase with the signal OUT1 in the first comparative example. The signal OUT1 in the first embodiment has steps at the midpoint 72 between the high level and the low level.

Figure 14:
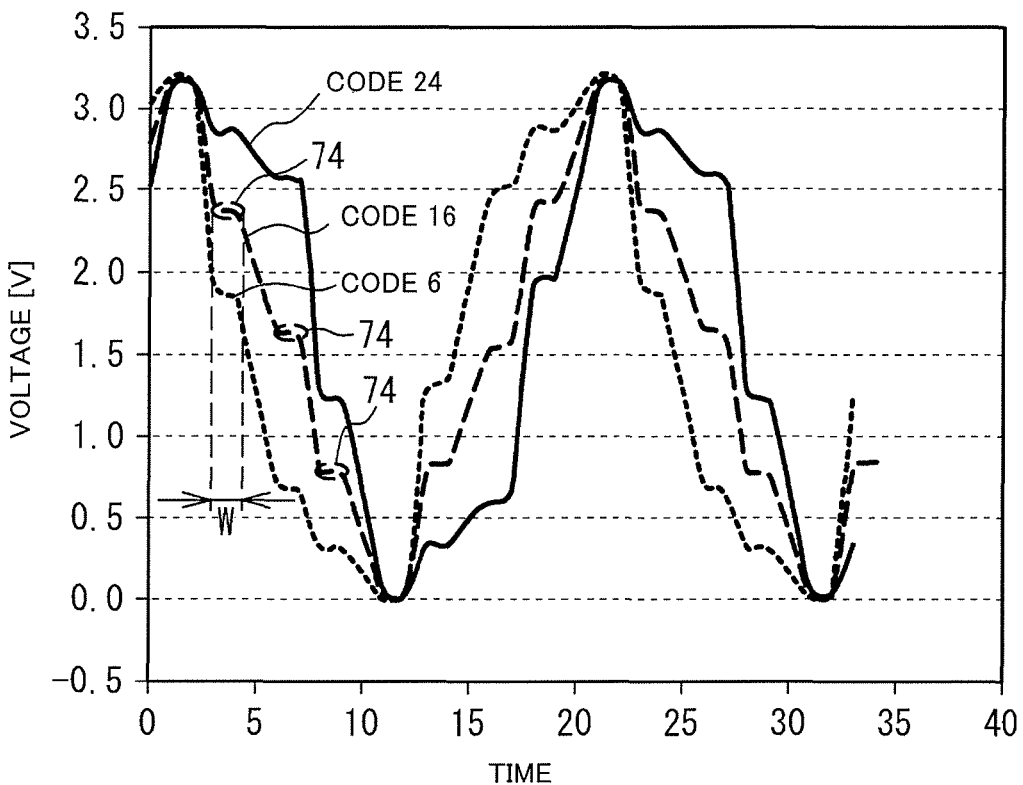
FIG. 14 is a waveform diagram of the output signal OUT1 from a mixer in the first embodiment.

FIG. 14 is a diagram of exemplary waveforms of the output signal OUT1 from the mixers of the first embodiment. Referring to FIG. 14, the mixer 12 combines the reference clock signals CK0 and CK90 with a weighting ratio of N:M, and the mixer 16 combines the reference clock signals CK45 and CK135 with a weight ratio of N:M. FIG. 14 illustrates waveforms of the signal OUT1 with N:M ratios of 39:9 (PI code 6), 24:24 (PI code 16) and 12:36 (PI code 24). Steps 74 are formed in three positions. Thus, the width W per step is smaller than that in the first comparative example.

Figure 15:
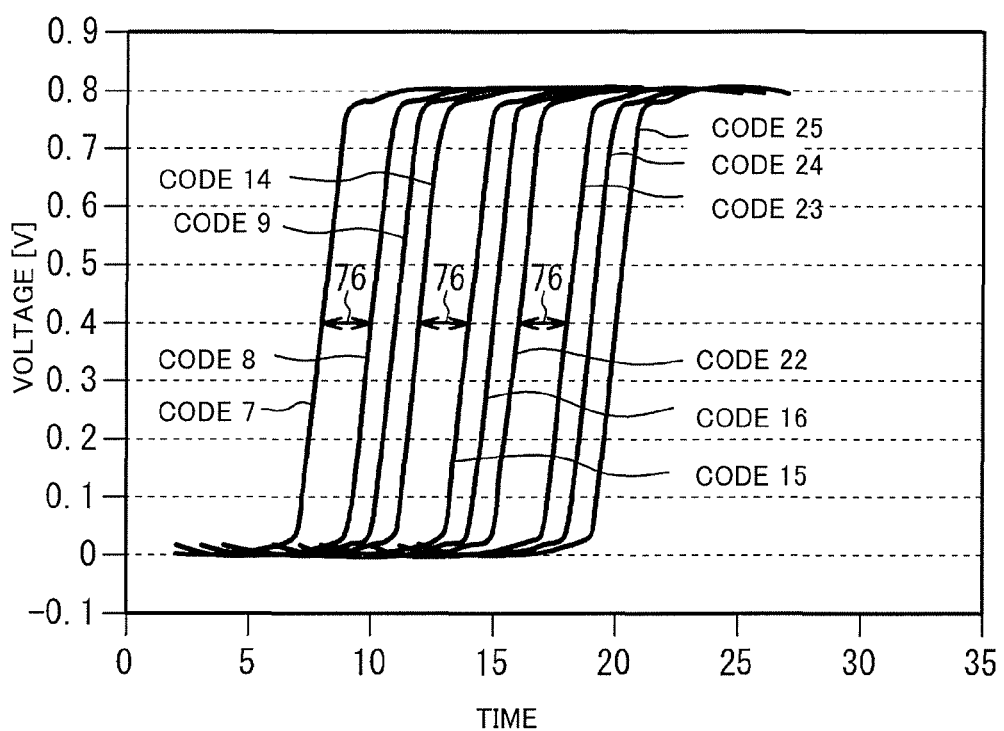
FIG. 15 is a waveform diagram of the clock signal OUT0 from a buffer in the first embodiment.

FIG. 15 is a diagram of exemplary waveforms of the output signal OUT0 from the corresponding buffer in the first embodiment. Referring to FIG. 15, there are three positions where the voltage rising with respect to the PI code changes greatly, as indicated by arrows 76 due to the three steps 74 in FIG. 14. It is to be noted that the amount of the change per position is smaller than that of the first comparative example in FIG. 7.

Figure 16:
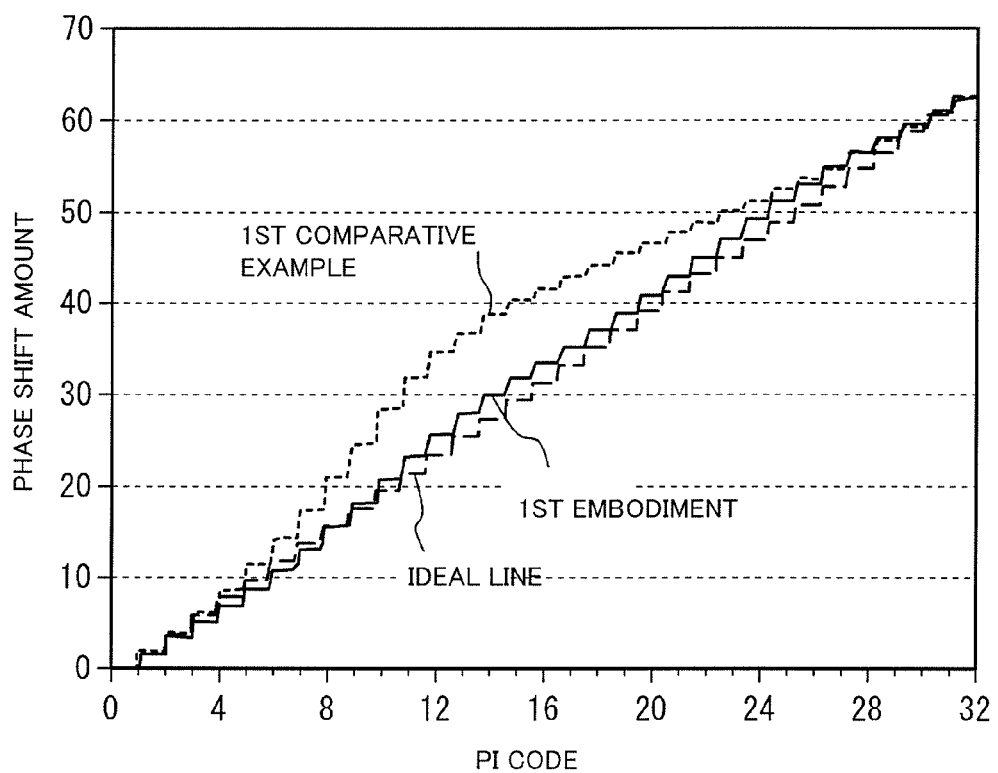
FIG. 16 is a diagram that illustrates a relation between the phase shift amount and the PI code.

FIG. 16 is a diagram that illustrates the phase of the clock signal with respect to the PI code. A solid line indicates the relation between the PI code and the clock signal in the first embodiment. The others are the same as those in FIG. 8. Referring to FIG. 16, the phase of the clock signal with respect to the PI code in the first embodiment is closer to the linear relation than that in the first comparative example.

According to the first embodiment, the mixer 12 (first circuit) weights the plurality of reference clock signals CK0, CK90, CK180 and CK270 having the mutually different phases (first reference signals) with a first ratio, and combines the weighted reference clock signals. In this manner, the mixer 12 generates the signal OUT11 (first intermediate signal). A change of the first ratio changes the phase of the signal OUT11. The mixer 14 (second circuit) weights the plurality of reference clock signals CK45, CK135, CK225, and CK315 having the mutually different phases (second reference signals) with a second ratio, combines the weighted reference clock signals, and generates the signal OUT12 (second intermediate signal). A change of the second ratio changes the phase of the signal OUT12. The node N1 (third circuit) combines the signals OUT11 and OUT12 to generate the signal OUT1 (output signal). The PI code generating circuit 20 outputs the same PI codes to the mixers 12 and 14 so that the first and second ratios are equal to each other.

As described above, the mixer 12 weights the reference clock signals CK0, CK90, CK180 and CK270 that are mutually 90° out of phase, and the mixer 14 weights the reference clocks CK45, CK135, CK225 and CK315 that are mutually 90° out of phase with the same weighting ratio as that of the mixer 12. The PI code generating circuit 20 outputs the same PI codes to the mixers 12 and 14. Thus, as illustrated in FIG. 16, the linearity of the phase with respect to the PI code is improved, as compared with the first comparative example. For example, the linearity may be improved to a level that is approximately equal to the level of the linearity in the second comparative example. Further, the mixers 12, 14, 16 and 18 may have the same circuit configuration as the mixers used in the first comparative example, and the PI codes output to the mixers 12, 14, 16 and 18 may be the same as those of the mixers used in the first comparative example. Therefore, the first embodiment is achieved without applying complicated changes to the first comparative example. The first embodiment has a circuit scale and area that are smaller than the second comparative example.

Out of the reference clock signals applied to the mixer 12, the phase difference between two a pair of reference clock signals that are adjacent to each other in phase may be unequal to the phase difference between another pair of reference clock signals that are adjacent to each other in phase. However, it is preferable that all the reference clock signals are separated at equal phase intervals. For example, out of the reference clock signals CK0, CK90, CK180 and CK270, any phase differences of the reference clock signals that are adjacent to each other in phase are 90°. Out of the reference clock signals applied to the mixer 14, the phase difference between a pair of reference clock signals that are adjacent to each other in phase may be unequal to the phase difference between another pair of different reference clock signals that are adjacent to each other in phase. However, it is preferable that all the reference clock signals are separated at equal phase intervals. For example, out of the reference clock signals CK45, CK135, CK225 and CK315, any phase differences of the reference clock signals that are adjacent to each other in phase are 90°. It is thus possible to improve the linearity of the phase with respect to the PI code.

It is preferable that the phases of the reference clock signals input to the mixer 14 are interposed between the reference clock signals that are two of the reference clock signals input to the mixer 12 and are adjacent to each other in phase. For example, the reference clock signals CK45, CK135, CK225 and CK315 are interposed between CK0 and CK90, between CK90 and CK180, between CK180 and between CK270 and CK270 and CK0. It is preferable that the phases of the reference clocks input to the mixer 14 are the midpoints between two of the reference clock signals that are applied to the mixer 12 and are adjacent to each other in phase. It is thus possible to improve the linearity of the phase with respect to the PI code.

The above-described first embodiment has an exemplary structure in which the clock signals are generated from the reference clock signals having the eight mutually different phases. For the purpose of improving the linearity, the first embodiment may be varied so as to use phases more than eight such as 12 phases or 16 phases. In use of the reference clock signals having 12 mutually different phases, it is preferable to set the currents IA through ID equal to ⅓ of those used in the first comparative example or to reduce the size of the transistor 32 to ⅓ of the size in the first comparative example. In use of the reference clock signals having 16 mutually different phases, it is preferable to set the currents IA through ID equal to ¼ of those used in the first comparative example or to reduce the size of the transistor 32 to ¼ of the size in the first comparative example.

The first embodiment may be varied so as to realize a phase interpolation circuit using reference clock signals having four mutually different phases by using a switch for turning off the mixers 14 and 18. For example, a case where clock signals having a comparatively high frequency has a better linearity than another case where clock signals having a comparatively low frequency. Therefore, the case where the clock signals having a high frequency may use a reduced number of mixers in order to reduce the parasitic capacities and realize higher operations. In contrast, the case where the clock signals having a low frequency may use the mixers 14 and 16 to form the phase interpolation circuit using the reference clock signals having the eight mutually different phases. With this structure, the linearity is improved.

The interpolation circuit of the first embodiment may be applied to the CDR circuit 50 illustrated in FIG. 1 or a similar circuit. The CDR circuit 50 may include a receiver circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A phase interpolation circuit comprising:
   a first circuit configured to generate a first intermediate signal by weighting first reference signals having different phases with a first ratio and combining weighed first reference signals;
   a second circuit configured to generate a second intermediate signal by weighing second reference signals having phases different from the phases of the first reference signals by a certain value with a second ratio equal to the first ratio and combining weighted second reference signals; and
   a third circuit configured to generate an output signal by combining the first intermediate signal and the second intermediate signal.

2. The phase interpolation circuit of claim 1, wherein any two of the first reference signals that are adjacent to each other in phase has an equal phase difference and any two of the second reference signals that are adjacent to each other in phase has an equal phase difference.

3. The phase interpolation circuit of claim 1, wherein the phase of any of the second reference signals is interposed between two of the first reference signals that are adjacent to each other in phase.

4. The phase interpolation circuit of claim 1, wherein a change of the first ratio causes the phase of the first intermediate signal to change, and a change of the second ratio causes the phase of the second intermediate signal to change.

5. The phase interpolation circuit of claim 1, wherein the third circuit includes a node that makes a physical interconnection between an output signal line of the first circuit through which the first intermediate signal is transmitted and an output signal line of the second circuit through which the second intermediate signal is transmitted, and is configured to output the output signal by combining the first and second intermediate signals at the node.

6. The phase interpolation circuit of claim 1, comprising a code generating circuit configured to generate identical codes that make the firs ratio and the second ratio equal to each other and supplies the first circuit and the second circuit with the codes.

7. The phase interpolation circuit of claim 2, wherein the phase of any of the second reference signals is interposed between two of the first reference signals that are adjacent to each other in phase.

8. The phase interpolation circuit of claim 1, wherein the different phases of the first reference signals are 0°, 90°, 180° and 270°, and the different phases of the second reference signals are 45°, 135°, 225° and 315°.

9. A receiver circuit comprising:
   a receiver configured to acquire data from a received signal in accordance with a clock signal;
   a detection circuit configured to detect a phase difference between the received signal and the clock signal on the basis of the data; and
   a phase interpolation circuit configured to adjust a phase of the clock signal on the basis of the phase difference,
   the phase interpolation circuit including:
   a first circuit configured to generate a first intermediate signal by weighting first reference signals having different phases with a first ratio and combining weighed first reference signals;
   a second circuit configured to generate a second intermediate signal by weighing second reference signals having phases different from the phases of the first reference signals by a certain value with a second ratio equal to the first ratio and combining weighted second reference signals; and
   a third circuit configured to generate the clock signal by combining the first intermediate signal and the second intermediate signal.

10. The receiver circuit of claim 9, wherein the phase interpolation circuit includes a code generating circuit configured to generate a code that indicates the first ratio and the second ratio on the basis of the phase difference and supplies the first and second circuits with the code.

11. The receiver circuit of claim 9, wherein any two of the first reference signals that are adjacent to each other in phase has an equal phase difference and any two of the second reference signals that are adjacent to each other in phase has an equal phase difference.

12. The receiver circuit of claim 9, wherein the phase of any of the second reference signals is interposed between two of the first reference signals that are adjacent to each other in phase.

13. The receiver circuit of claim 9, wherein a change of the first ratio causes the phase of the first intermediate signal to change, and a change of the second ratio causes the phase of the second intermediate signal to change.

14. The receiver circuit of claim 9, wherein the third circuit includes a node that makes a physical interconnection between an output signal line of the first circuit through which the first intermediate signal is transmitted and an output signal line of the second circuit through which the second intermediate signal is transmitted, and is configured to output the output signal by combining the first and second intermediate signals at the node.

15. The receiver circuit of claim 9, comprising a code generating circuit configured to generate identical codes that make the firs ratio and the second ratio equal to each other and supplies the first circuit and the second circuit with the codes.

16. The receiver circuit of claim 11, wherein the phase of any of the second reference signals is interposed between two of the first reference signals that are adjacent to each other in phase.

17. The receiver circuit of claim 9, wherein the different phases of the first reference signals are 0°, 90°, 180° and 270°, and the different phases of the second reference signals are 45°, 135°, 225° and 315°.

\* \* \* \* \*